United States Patent
Fischer et al.

(10) Patent No.: US 7,301,977 B2
(45) Date of Patent: Nov. 27, 2007

(54) TUNEABLE UNIPOLAR LASERS

(75) Inventors: Marc Oliver Fischer, Würzburg (DE); Alfred Forchel, Würzburg (DE)

(73) Assignee: Nanoplus GmbH, Gerbrunn (DE)

(*) Notice: Subject to any disclaimer, the term of this patent is extended or adjusted under 35 U.S.C. 154(b) by 265 days.

(21) Appl. No.: 10/865,036

(22) Filed: Jun. 10, 2004

(65) Prior Publication Data

US 2005/0276298 A1    Dec. 15, 2005

(51) Int. Cl.
*H01S 5/00* (2006.01)
*H01S 3/082* (2006.01)

(52) U.S. Cl. .............. 372/43.01; 372/45.01; 372/97

(58) Field of Classification Search .......... 372/45.01, 372/45.012, 49.01, 92, 97
See application file for complete search history.

(56) References Cited

U.S. PATENT DOCUMENTS

| | | | | |
|---|---|---|---|---|
| 4,875,216 A | * | 10/1989 | Thornton et al. | 372/45.01 |
| 5,457,709 A | * | 10/1995 | Capasso et al. | 372/45.01 |
| 5,509,025 A | | 4/1996 | Capasso et al. | 372/45 |
| 5,936,989 A | | 8/1999 | Capasso et al. | 372/45 |
| 5,978,397 A | | 11/1999 | Capasso et al. | 372/45 |
| 5,978,402 A | * | 11/1999 | Matsumoto et al. | 372/50.1 |
| 5,982,804 A | * | 11/1999 | Chen et al. | 372/96 |
| 6,055,257 A | * | 4/2000 | Baillargeon et al. | 372/46.01 |
| 6,137,817 A | | 10/2000 | Baillargeon et al. | 372/45 |
| 6,148,012 A | * | 11/2000 | Capasso et al. | 372/45.012 |
| 6,154,475 A | * | 11/2000 | Soref et al. | 372/45.011 |
| 6,292,503 B1 | * | 9/2001 | Watanabe et al. | 372/45.01 |
| 6,307,873 B1 | * | 10/2001 | Geels et al. | 372/46.01 |
| 6,324,199 B1 | * | 11/2001 | Capasso et al. | 372/45.01 |
| 6,400,744 B1 | * | 6/2002 | Capasso et al. | 372/96 |
| 6,410,416 B1 | * | 6/2002 | Dodabalapur et al. | 438/615 |
| 6,501,783 B1 | * | 12/2002 | Capasso et al. | 372/96 |

(Continued)

FOREIGN PATENT DOCUMENTS

EP    0 877 454    11/1998

(Continued)

OTHER PUBLICATIONS

R.F. Kazarinov et al, "Possibility of the Amplification of Electromagnetic Waves in a Semiconductor with a Superlattice", Soviet Physics—Semiconductors, vol. 5, No. 4, Oct. 1971, pp. 707-709.

(Continued)

*Primary Examiner*—Minsun Oh Harvey
*Assistant Examiner*—Phillip Nguyen
(74) *Attorney, Agent, or Firm*—Michaelson & Assocaites; Peter L. Michaelson; George Wolken, Jr.

(57) ABSTRACT

A unipolar semiconductor laser is provided in which an active region is sandwiched in a guiding structure between an upper and lower cladding layer, the lower cladding layer being situated on a semiconducting substrate. The unipolar semiconductor laser comprises a raised ridge section running from end to end between end mirrors defining the laser cavity. The ridge section aids in optical and electrical confinement. The ridge waveguide is divided in a plurality of cavity segments (at least two). Lattice structures can be arranged on and/or adjacent to these cavity segments. Each cavity segment is in contact with upper metallic electrodes. A metallic electrode coupled to the bottom surface of the semiconducting substrate facilitates current injection through the device.

11 Claims, 11 Drawing Sheets

U.S. PATENT DOCUMENTS

| | | | |
|---|---|---|---|
| 6,560,259 B1 | 5/2003 | Hwang | 372/45 |
| 6,563,852 B1* | 5/2003 | Baillargeon et al. | 372/45.01 |
| 6,665,325 B2 | 12/2003 | Beck et al. | 372/46 |
| 6,668,001 B2* | 12/2003 | Ohkubo | 372/45.01 |
| 6,836,499 B2* | 12/2004 | Capasso et al. | 372/50.22 |
| 6,846,689 B2* | 1/2005 | Forchel et al. | 438/31 |
| 7,061,962 B2* | 6/2006 | Reithmaier et al. | 372/96 |
| 2004/0013145 A1 | 1/2004 | Faist et al. | 372/45 |
| 2004/0109485 A1* | 6/2004 | Flory et al. | 372/45 |
| 2004/0161009 A1* | 8/2004 | Edamura et al. | 372/45 |

FOREIGN PATENT DOCUMENTS

| | | |
|---|---|---|
| EP | 1 133 035 | 9/2001 |

OTHER PUBLICATIONS

AB. Jerome Faist et al, "Quantum Cascade Laser", Science, vol. 264, Apr. 22, 1994, pp. 553-556.

Aellen et al, "Continuous-Wave Distributed-Feedback Quantum-Cascade Lasers on a Peltier Cooler", *Applied Physics Letters*, (© 2003 American Institute of Physics) vol. 83, No. 10, Sep. 8, 2003, pp. 1929-1931.

Anders et al, "Room-Temperature Emission of GaAs/AlGaAs Superlattice Quantum-Cascade Lasers at 12.6 μm", *Applied Physics Letters*, (© 2002 American Institute of Physics) vol. 80, No. 11, Mar. 18, 2002, pp. 1864-1866.

Anders et al, "Room Temperature Lasing of Electrically Pumped Quantum Cascade Micro-cylinders", *Physica E* (2003), (© 2002 Elsevier Science B.V.) vol. 17, pp. 626-628.

Beck et al, "Continuous Wave Operation of Quantum Cascade Lasers", *Journal of Crystal Growth 251* (2003) (© Elsevier Science B.V.) pp. 697-700.

Capasso et al, "Quantum Cascade Lasers: Ultrahigh-Speed Operation, Optical Wireless Communication, Narrow Linewidth, and Far-Infrared Emission", *IEEE Journal of Quantum Electronics* (© 2002 IEEE) vol. 38, No. 6, Jun. 2002, pp. 511-532.

Coldren et al, "Continuously-Tunable Single-Frequency Semiconductor Lasers", *IEEE Journal of Quantum Electronics* (© 1987 IEEE) vol. QE-23, No. 6, Jun. 1987, pp. 903-908.

Colombelli et al, "Quantum Cascade Suface-Emitting Photonic Crystal Laser", *Science*, vol. 302, Nov. 21, 2003, pp. 1374-1377.

Delorme, "Widely Tunable 1.55-μm Lasers for Wavelength-Division-Multiplexed Optical Fiber Communications", *IEEE Journal of Quantum Electronics* (© 1998 IEEE) vol. 34, No. 9, Sep. 1998, pp. 1706-1716.

Faist et al, "Bound-to-Continuum and Two-Phonon Resonance Quantum-Cascade Lasers for High Duty Cycle, High-Temperature Operation", *IEEE Journal of Quantum Electronics* (© 2002 IEEE) vol. 38, No. 6, Jun. 2002, pp. 533-546.

Faist et al, "Distributed Feedback Quantum Cascade Lasers" *Applied Physics Letters* (© American Institute of Physics) vol. 70, No. 20, May 19, 1997, pp. 2670-2672.

Gauggel et al, "Wide-Range Tunability of GaInP-AlGaInP DFB Lasers with Superstructure Gratings", *IEEE Photonics Technology Letters* (© 1997 IEEE) vol. 9, No. 1, Jan. 1997, pp. 14-16.

Gmachl et al, "Quantum Cascade Lasers with a Heterogeneous Cascade: Two-Wavelength Operation" *Applied Physics Letters* (© 2001 American Institute of Physics) vol. 79, No. 5, Jul. 30, 2001, pp. 572-574.

Gmachl et al, "Single-Mode, Tunable Distributed-Feedback and Multiple-Wavelength Quantum Cascade Lasers" *IEEE Journal of Quantum Electronics* (© 2002 IEEE) vol. 38, No. 6, Jun. 2002, pp. 569-581.

Gmachl et al, "Temperature Dependence and Single-Mode Tuning Behavior of Second-Harmonic Generation in Quantum Cascade Lasers", *Applied Physics Letters* (© 2004 American Institute of Physics) vol. 84, No. 15, Apr. 12, 2004, pp. 2751-2753.

Hofling et al, "Edge-Emitting GaInAs-AlGaAs Microlasers" *IEEE Photonics Technology Letters* (© 1999 IEEE) vol. 11, No. 8, Aug. 1999, pp. 943-945.

Hofling et al, "GaAs/AlGaAs Quantum Cascade Micro Lasers Based on Monolithic Semiconductor-Air Bragg Mirrors" *Electronics Letters*, vol. 40, No. 2, Jan. 22, 2004.

Hofstteter et al, "High-Temperature Operation of Distributed Feedback Quantum-Cascade Lasers at 5.3 μm" *Applied Physics Letters* (© 2001 American Institute of Physics) vol. 78, No. 4, Jan. 22, 2001, pp. 396-398.

Hong et al, "Cascaded Strongly Gain-Coupled (SGC) DFB Lasers with 15-nm Continuous-Wavelength Tuning", *IEEE Photonics Technology Letters* (© 1999 IEEE) vol. 11, No. 10, Oct. 1999, pp. 1214-1216.

Hvozdara et al, "Quantum Cascade Lasers with monolithic Air-Semiconductor Bragg Reflectors", *Applied Physics Letters* (© 2000 American Institute of Physics) vol. 77, No. 9, Aug. 28, 2000, pp. 1241-1243.

Ishii et al, "Quasicontinuous Wavelength Tuning in Super-Structure-Grating (SSG) DBR Lasers" *IEEE Journal of Quantum Electronics* (© 1996 IEEE) vol. 32, No. 3, Mar. 1996, pp. 433-441.

Jayaraman et al, "Theory, Design, and Performance of Extended Tuning Range Semiconductor Lasers with Sampled Gratings" *IEEE Journal of Quantum Electronics* (© 1993 IEEE) vol. 29, No. 6, Jun. 1993, pp. 1824-1834.

Kohler et al, "Single-Mode Tunable, Pulsed, and Continuous Wave Quantum-Cascade Distributed Feedback Lasers at $\lambda \cong 4.6$-4.7 μm", *Applied Physics Letters* (© 2000 American Institute of Physics) vol. 76, No. 9, Feb. 28, 2000, pp. 1092-1094.

Kohler, "Single-Mode Tunable Quantum Cascade Lasers in the Spectral Range of the $CO_2$ Laser at $\lambda$ = 9.5-10.5 μm", *IEEE Photonics Technology Letters* (© 2000 IEEE) vol. 12, No. 5, May 2000, pp. 474-476.

Kuznetsov, "Theory of Wavelength Tuning in Two-Segment Distributed Feedback Lasers" *IEEE Journal of Quantum Electronics* (© 1988 IEEE) vol. 24, No. 9, Sep. 1988, pp. 1837-1844.

Mason et al, "Ridge Waveguide Sampled Grating DBR Lasers with 22-nm Quasi-Continuous Tuning Range" , *IEEE Photonics Technology Letters* (© 1998 IEEE) vol. 10, No. 9, Sep. 1998, pp. 1211-1213.

Muller et al, "Electrically Tunable, Room-Temperature Quantum-Cascade Lasers", *Applied Physics Letters* (© 1999 American Institute of Physics) vol. 75, No. 11, Sep. 13, 1999, pp. 1509-1511.

Muller et al, "Wide-Range-Tunable Laterally Coupled Distributed Feedback Lasers Based on InGaAsP-InP", *Applied Physics Letters* (© 2001 American Institute of Physics) vol. 79, No. 17, Oct. 22, 2001, pp. 2684-2686.

Page et al, "300 K Operation of a GaAs-Based Quantum-Cascade Laser at $\lambda \approx 9$ μm", *Applied Physics Letters* (© 2001 American Institute of Physics) vol. 78, No. 22, May 28, 2001, pp. 3529-3531.

Page et al, "High Reflectivity Metallic Mirror Coatings for Mid-Infrared ($\lambda \approx 9$ μm) Unipolar Semiconductor Lasers", *Semiconductor Science and Technology* (© 2002 IOP Publishing Ltd) vol. 17, pp. 1312-1316.

Page et al, "Optimised Device Processing for Continuous-Wave Operation in GaAs-Based Quantum Cascade Lasers", *Electronics Letters*, vol. 39, No. 14, Jul. 10, 2003.

Pflugl et al, "High-Temperature Performance of GaAs-Based Bound-to-Continuum Quantum-Cascade Lasers", *Applied Physics Letters* (© 2003 American Institute of Physics) vol. 83, No. 23, Dec. 8, 2003, pp. 4698-4700.

Rochat et al, "Long-Wavelength ($\lambda \approx 16$ μm), Room-Temperature, Single-Frequency Quantum-Cascade Lasers Based on a Bound-to-Continuum Transition" *Applied Physics Letters* (© 2001 American Institute of Physics) vol. 79, No. 26, Dec. 24, 2001, pp. 4271-4273.

Schrenk et al, "Continuous-Wave Operation of Distributed Feedback AlAs/GaAs Superlattice Quantum-Cascade Lasers" *Applied Physics Letters* (© 2000 American Institute of Physics) vol. 77, No. 21, Nov. 20, 2000, pp. 3328-3330.

Schrenk et al, "GaAs/AlGaAs Distributed Feedback Quantum Cascade Lasers", *Applied Physics Letters* (© 2000 American Institute of Physics) vol. 76, No. 3, Jan. 17, 2000, pp. 253-255.

Schrenk et al, "High Performance Single Mode GaAs Quantum Cascade Lasers", Physica E (© 2002 Elsevier Science B.V.) vol. 12, pp. 840-843.

Sirtori et al, "GaAs/Al$_x$Ga$_{1-x}$As Quantum Cascade Lasers", *Applied Physics Letters* (© 1998 American Institute of Physics) vol. 73, No. 24, Dec. 14, 1998, pp. 3486-3488.

Sirtori et al, "GaAs-AlGaAs Quantum Cascade Lasers: Physics, Technology, and Prospects", *IEEE Journal of Quantum Electronics* (© 2002 IEEE) vol. 38, No. 6, Jun. 2002, pp. 547-558.

Sirtori et al, "Low-Loss Al-Free Waveguides for Unipolar Semiconductor Lasers", *Applied Physics Letters* (© 1999 American Institute of Physics) vol. 75, No. 25, Dec. 20, 1999, pp. 3911-3913.

Strasser et al, "Intersubband and Interminiband GaAs/AlGaAs Quantum Cascade Lasers", *Physica E* (© 2000 Elsevier Science B.V.) vol. 7, pp. 1-7.

Straub et al, "Simultaneously at Two Wavelengths (5.0 and 7.5 μm) Singlemode and Tunable Quantum Cascade Distributed Feedback Lasers", *Electronics Letters*, vol. 38, No. 12, Jun. 6, 2002, pp. 565-567.

* cited by examiner

TUNEABLE UNIPOLAR LASERS

FIELD OF THE INVENTION

The present invention relates to unipolar lasers with a semiconductor substrate, a laser structure containing an active region sandwiched in a waveguide structure and arranged on the semiconductor substrate, a waveguide ridge divided into a plurality of cavity segments (at least two) and separate contacts to each of the cavity segments. Each of the cavity segments of the waveguide ridge can carry a specially designed lattice structure at a distance from the active region. The present invention further relates to a technological process for the production of such a widely tunable unipolar laser.

BACKGROUND OF THE INVENTION

Conventional semiconductor lasers are based on band-band transitions within a p-n- junction and are inherently limited in the maximal attainable emission wavelength. In contrast, for unipolar laser devices, i.e., lasers based on the injection of one type of carrier, no comparable long wavelength limit exists. The operating principle of a unipolar laser is based on the possibility of amplifying an electromagnetic wave in a semiconductor structure containing a superlattice, as described in 1971 by Kazarinov and Suris. Kazarinov and Suris disclose a coherent IR source based on intersubband transitions in quantum wells and tunnelling injection cascading through many identical stages for multiple photon generation. First laser operation based on this principle was demonstrated in 1994 by scientists working at Bell Labs who pointed out an inherent characteristic of unipolar lasers. That is, a unipolar laser comprises a multi-layer semiconductor structure containing doped semiconducting material of only a single conductivity type, thereby producing laser emissions with only one type of carrier (e.g. U.S. Pat. No. 5,457,709, col. 2, lines 24-32, and U.S. Pat. No. 5,509,025, col. 2, lines 29-37). First laser operation based on this principle was demonstrated in 1994 by scientists working at Bell Labs.

A unipolar laser consists of an active region sandwiched in an optical waveguide structure. The active region consists of a plurality of nominal identical stages for multiple photon generation and is designed to emit at a wavelength λ. The optical waveguide structure consists of lower and upper guiding layers with relatively high refractive index sandwiched between lower and upper cladding layers with relatively small refractive index. The active region is sandwiched between the lower and upper guiding layers. The generated optical radiation is thereby guided within the higher-index guiding layers.

For many applications, for example sensing or spectroscopy, single-mode laser emission is very advantageous. In a DFB (distributed feedback) unipolar laser, only laser radiation with one specific longitudinal laser mode is emitted while other modes are suppressed by a periodic lattice. The standard DFB unipolar laser uses a periodic lattice with a certain period in order to achieve laser emission at the desired fixed wavelength. Tuning of the emission wavelength in conventional DFB unipolar lasers is possible by variation of the injection current or the temperature of the laser, but typically only over a very limited spectral range. Thus, conventional DFB unipolar lasers exhibit a narrow linewidth as advantageous for sensing and other applications, but the wavelength tunability is limited.

For many applications, such as spectroscopy, a broader wavelength tuning range would be desirable. Pursuant to some embodiments of the present invention, a wider tuning range is achieved by using unipolar lasers that include several cavity segments. In some embodiments, each of the segments includes a specially designed lattice structure. In some embodiments, one or more of the cavity segments are fabricated without gratings. Typically, each cavity segment is provided with a contact, which allows for control of the drive current of this cavity segment independent from that of the other segments. Tuning of the device is typically accomplished by changing the ratio of the currents through the cavity segments of the laser and by changing the device temperature. In addition to tunable unipolar laser devices, the present invention also relates to materials and methods of fabricating such devices.

SUMMARY OF THE INVENTION

A primary objective of the present invention is to produce a tuneable unipolar laser, especially single-mode laser, including materials and methods of fabricating such lasers.

According to some embodiments of the present invention, a unipolar semiconductor laser is described on a semiconductor substrate. These embodiments include a unipolar active region arranged on the semiconductor substrate. This active region is sandwiched in a waveguide structure. A waveguide ridge is arranged at a distance from the active region. The waveguide ridge is divided into a plurality of individual cavity segments (at least two) with certain coupling between these segments. This coupling between cavities can be realized in various ways. In some embodiments, an air gap between the different cavity sections can be used. The extent of this air gap influences the amount of coupling. In the limiting case of no air gap, maximum coupling between different cavity sections is achieved. However, other approaches can be used to achieve optimal or near-optimal coupling between cavities, including but not limited to, coupling between sections using periodic refractive index patterns. For example, photonic crystal structures including two dimensional hole patterns or one dimensional slit patterns in the semiconductor can be used to achieve the desired coupling, typically optimal or near-optimal, between different cavities.

Each cavity segment of the waveguide ridge is typically in contact with an upper metallic electrode. A metallic electrode coupled to the bottom surface of the semiconducting substrate facilitates current injection through the individual cavity sections of the device. "Cavity segment," "cavity section," "laser segment" are used herein synonymously to denote a portion of the waveguide ridge and the terms are equivalent.

For each segment a "mode comb" having user-defined energy spacings between the modes is defined by the allowed longitudinal modes within the gain region of the laser structure. Different principles for selecting a set of longitudinal modes may be used in each of these segments. For example:

a) By choosing a well-defined length for each segment, longitudinal modes are defined. In this case the length of the segment is proportional to an integer number of half wavelengths of the electromagnetic radiation.

b) Alternatively, by using a lattice structure located atop of the waveguide ridge or located laterally with respect to the waveguide ridge, a set of longitudinal modes can be selected. The lattice structure is formed at a distance from the active region. The position, dimension and geometric shape of the lattice structure can be used to define the amount of coupling with the guided optical radiation. By a periodic variation of the real and/or imaginary part of the refractive index, a specific longitudinal laser mode can be selected. In contrast to a standard distributed feedback laser lattice which is based on a single lattice period, the lattice structures formed along different cavity sections of the ridge waveguide as described herein typically include a superstructure composed of several lattices with different lattice periods to achieve multiple reflectivity, absorption and/or gain peaks. For an absorbing lattice, multiple minima of the absorption are provided. By changing the amplitudes and periods of the constituent lattices, a flexible control over the spectral position and the magnitude of the dips in the absorption of the lattice can be obtained. The lattice structures can also include an optional phase shift region in the lattice structure.

In all these approaches to longitudinal mode selection for each segment, a "mode comb" is defined by the allowed longitudinal modes within the gain region of the laser structure. Mixed structures in which, for example, one segment includes a lattice structure whereas one or several others do not contain lattice structures, are also possible sources of tuneable single mode emission. In such tuneable unipolar single-mode lasers, single longitudinal modes are selected by the overlap of the longitudinal modes of the individual segments. The energy spacing between the longitudinal modes is designed to be different for each cavity segment, so that the allowed modes (given by the "mode combs") of the different cavity segments align only at one particular energetic position. This is the energy (wavelength) at which the laser emission will take place. By changing the drive currents of the cavity segments, the relative positions of the "mode combs" can be shifted and the allowed modes for the different cavity segments brought into alignment at a different wavelength. In this manner, a discrete tuning between a set of wavelengths defined by the lattice structures and the dimensions of the cavity segments is possible. If the spacing between the addressable wavelengths is sufficiently small, any intermediate wavelength can be accessed by a simultaneous change of the drive currents in the cavity segments or by a combined variation of the device temperature and of the drive currents.

Additional cavity sections without a lattice structure can be used as "gain-sections" to provide amplification of the single-mode emission generated by the methods described herein. Since the injected currents into these "gain-sections" are independent of the currents in the cavity segments used to generate single-mode emission, flexible control of the output power of the unipolar single-mode laser can be achieved in this case.

Some embodiments of the invention provide a tuneable unipolar single-mode laser with a lattice structure produced following the conclusion of the epitaxial growth of the laser layer on the semiconductor substrate. By virtue of this subsequent production of cavity segments and lattice structure, it is possible to determine the individual amplification spectrum of the epitaxial unipolar laser structure ("epitaxial structure" in brief) before the production of the lattice structure and cavity segments such that, by selective pre-definitions of the parameters of the cavity segment dimensions and lattice structure, it is possible to subsequently produce the desired laser profile in a very precise manner. Thus, one is able to reproducibly manufacture tuneable unipolar single-mode lasers with a precisely defined wavelength or laser mode.

The structural design according to some embodiments of the present invention also facilitates an undisturbed, continuous formation of the laser layer in the epitaxial process so that unnecessary defects, which can impair the power output characteristics of the laser layer or the tunable laser, typically do not arise. The arrangement of the lattice structure at a distance from the active laser layer also helps in preventing the subsequent impairment of the laser layer. As the epitaxial unipolar laser structure is grown without interruption, the manufacturing cost of tuneable lasers can be markedly reduced. The lattice structure modulates periodically the losses or the gain and the refractive power for light propagating through the laser. In this way the tuneable unipolar laser according to some embodiments of the present invention facilitates a complex coupling of the laser radiation with the lattice structure with modulation of the real- and imaginary parts of the refractive index.

To permit a highly precise setting of the distance or relative position between the lattice structure and the active laser layer of the unipolar laser in the production of the tunable unipolar laser, the lattice structure can be arranged on a layer arranged in parallel to the laser layer.

If a metal is used to form the lattice structure, the advantageous effects described in the foregoing can be achieved to a particularly comprehensive extent. Irrespective of the material selected to construct the lattice structure, the lattice structure can also be formed by material removal, not only by material application. In particular, the lattice structure can be formed as an overlying structure (e.g., a metal lattice structure), as well as defined into the upper cladding layer by an etched structure and successive filling of the resulting grooves by other material (e.g., a metal). Important in this context is the close contact between lattice structure and upper metallic electrode for efficient current injection to each of the cavity segments. If a metal is used to define the lattice structure, it is particularly advantageous to use the same metal also for the fabrication of the top contact layer to each section. In particular, a metal layer sequence (e.g., Cr, Pt, Au layers of various thickness) can also be used for this purpose. In order to improve the electrical injection, it proves advantageous for the sides of the waveguide ridge to be arranged substantially at right angles to the plane in which the lattice structure extends.

The typical semiconductor unipolar laser includes opposed front and back surfaces, referred to as front and back facets. These facets are typically obtained by cleaving. In order to control the light output and to direct it as desired, for example preferentially to the front side, it might become necessary to increase the back facet reflectivity. Furthermore in order to realize other properties of the device, e.g., small threshold currents, it may be advisable to also increase the reflectivity at the front surface. The threshold current for laser onset is proportional to $\exp[2(\alpha_i+\alpha_m)/\Gamma g_o]$, where $\Gamma$ is the confinement factor, $g_o$ is the material gain, $\alpha_i$ is the internal absorption and $\alpha_m=1/L*\ln(1/R)$ are the mirror losses. Therefore the threshold current for any given laser length L can be significantly reduced if the resonator reflectivity R is increased. By increasing the reflectivity, i.e., decreasing the mirror losses $\alpha_m$, the length L of the device can be simultaneously reduced without a significant loss of performance as compared to lasers of the same lengths without additional reflectors. By using high facet reflectivities, the slope efficiency, i.e., the output power dependence on the drive current, can also be increased as compared to lasers with cleaved facets using highly reflective mirrors on one or both ends of the ridge.

This increase in reflectivity might, for example, be obtained by defining a Bragg reflector structure adjacent to the laser facet(s). Typically a Bragg reflector structure is realized by applying different dielectric materials of appropriate thickness to the facets. Since many dielectric materials have absorbing properties in the wavelength range of interest, a particularly useful approach for a unipolar laser is the definition of a Bragg reflector using an air-semiconductor mirror structure. These reflectors are arranged perpendicular to the laser ridge at a certain distance from one or both ends. The width of the mirror plates as well as the width of the air gap depend on the emission wavelength of the device. The dimensions of the mirror plates can extend beyond the ridge width dimensions to reduce diffraction losses of the laser light. By such a unipolar laser with Bragg mirrors at one or both end facets, particularly low current densities and high output powers can be achieved. This can be used to increase the upper temperature of laser operation with respect to devices with cleaved facets. The Bragg mirrors can be realized as mirror plates separated by gaps. Alternatively they can also be realised by a two dimensional periodic pattern involving for example air holes. In both cases the change of refractive index can be used to modify the reflectivity compared to cleaved facets. Similar structures can also be used to control the coupling between the unipolar laser segments. However, the Bragg mirrors are optional structures to modify the facet ref lectivities which can be omitted if desired.

In a process according to some embodiments of the invention, on a base consisting of a semiconductor substrate, a complete unipolar semiconductor laser structure is produced in an epitaxial process with the subsequent formation of a waveguide ridge. This waveguide ridge is divided into a plurality of cavity sections by subjecting the semiconductor laser structure to a material removal process and the subsequent application of a lattice structure to various cavity sections. Irrespective of the material selected to form the lattice structure, the lattice structure can also be produced by material removal, not only by material application.

A processes according to some embodiments of the invention as briefly described in the foregoing thus facilitates the production of functional lasers in a first process phase, thereby facilitating the precise checking and determination of the electrical and optical properties, for example determination of the individual amplification spectrum of the epitaxial unipolar laser structure used for the laser fabrication. Only thereafter in a second process phase, by the formation of cavity segments and lattice structures with defined parameters, are single-mode tuneable unipolar lasers obtained.

In those embodiments in which the lattice structure is produced by the application of a lattice, the use of a lithographic process, for example by optical or electron beam lithography with subsequent etching of the lattice followed by a metallization, proves particularly advantageous.

A variant of the production process which is particularly advantageous from an economic standpoint is possible if, for the production of a plurality of tuneable unipolar lasers with different properties, a semiconductor laser wafer is first produced by applying an epitaxial structure to a semiconductor substrate, whereupon the waveguide ridges associated with the individual lasers are produced in the composite wafer by forming a waveguide structure which is arranged on the surface of the semiconductor laser wafer and which comprises waveguide ridges extending in parallel to one another. Only thereafter is the semiconductor laser wafer divided up into separate semiconductor laser chip units, whereby properties associated with the individual lasers are then controlled by the application of different cavity segments and corresponding lattice structures to these cavity segments along the surface of the waveguide ridges with corresponding structural parameters on a selected number of lasers.

It is thus possible for the lasers which have been produced on the composite wafer and are already provided with the waveguide ridge to be used as basic lasers or "unfinished" lasers with defined electrical and optical properties whereupon, from this reservoir of identically formed basic lasers, the required number of lasers can then be selected and, by the realization of defined cavity structures and lattice structures, the desired number of tuneable unipolar lasers with precisely defined optical and electrical properties can be produced substantially without rejects.

In the following, the construction of various embodiments of a tuneable unipolar laser according to some embodiments of the invention and a possible process for the production thereof will be explained in detail making reference to the drawings.

The various features of novelty which characterise the invention are pointed out with particularity in the claims annexed to and forming a part of this disclosure. For a better understanding of the invention, its operating advantages and specific objects attained by its uses, reference is made to the accompanying drawings and descriptive matter in which various embodiments of the invention are illustrated.

BRIEF DESCRIPTION OF THE DRAWINGS

The drawings herein are not to scale.

DETAILED DESCRIPTION

Figure 1A:
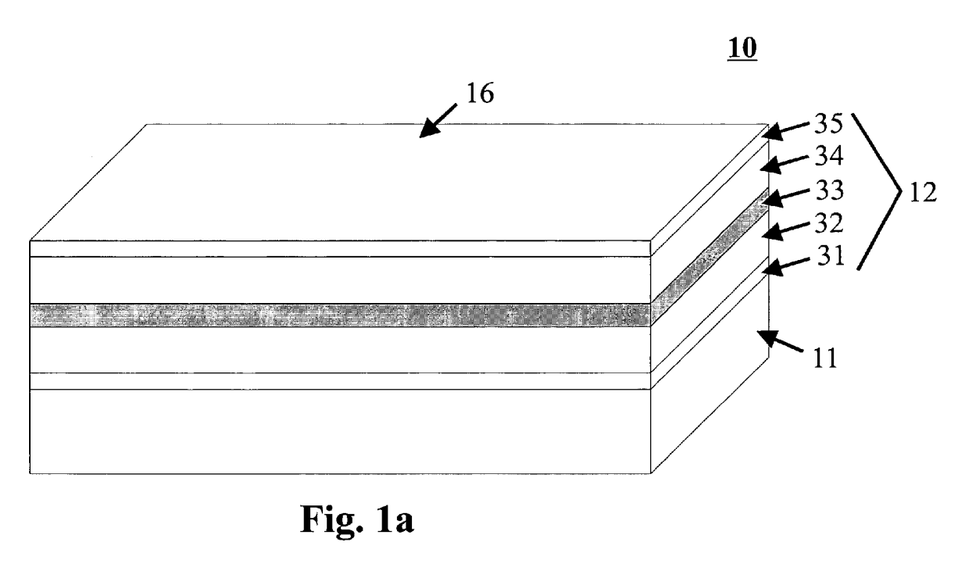
FIG. 1a is a schematic perspective view of one embodiment of the tunable unipolar laser of the invention in an early stage of fabrication.

FIGS. 1a-1d illustrate typical steps in the fabrication of a tunable unipolar laser 10. Referring to the drawings in particular, FIG. 1a is a simplified perspective view of an exemplary tunable unipolar laser 10 comprising a semiconducting substrate 11 and an epitaxial structure 12 grown thereon. The epitaxial structure comprises a lower cladding layer 31, a lower guiding layer 32, an active region 33 suitable for lasing in a region of wavelengths around a wavelength λ, an upper guiding layer 34 and an upper cladding layer 35 having an upper surface 16. Semiconducting substrate 11 and epitaxial structure 12 contain doped semiconductor material of only one conductivity type (either only n-type or only p-type). For a wide tuning range of the laser, an active region with an engineered broad spectral gain region is advantageous.

In an exemplary embodiment of the invention, the active region is designed for laser emission at an infrared wavelength λ around 9.5 µm. The active region consisting of a plurality of nominal identical stages for multiple photon generation has a total thickness of 3.2 µm. Layer 32 and layer 34 are GaAs with a thickness of 3.4 µm and doped to $5 \times 10^{16}$ cm$^{-3}$. Layer 31 and layer 35 are GaAs with a thickness of 1.4 µm and doped to $5 \times 10^{18}$ cm$^{-3}$.

Figure 1B:
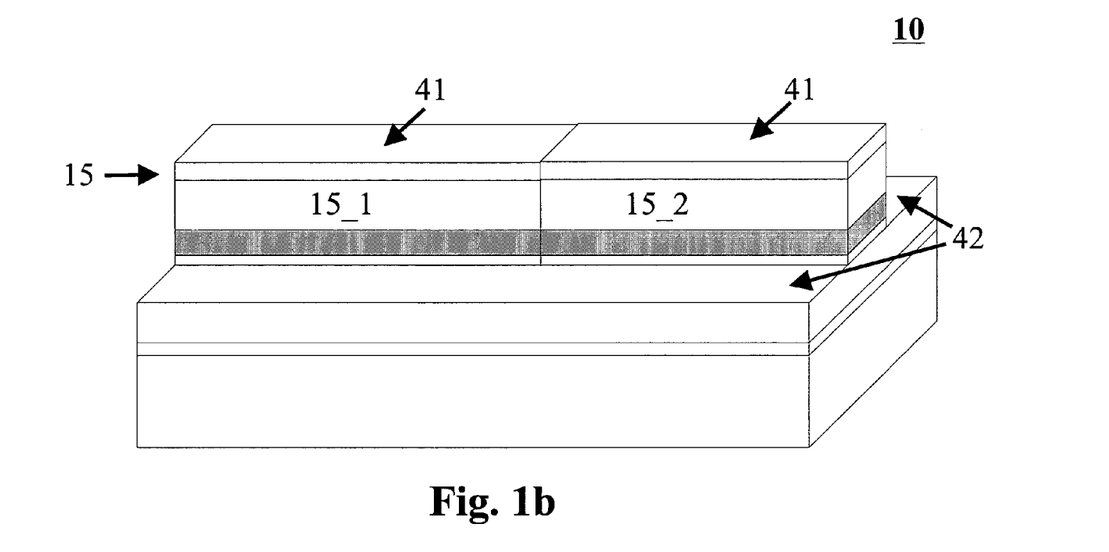
FIG. 1b is a schematic perspective view of the tunable unipolar laser in FIG. 1a in a subsequent stage of fabrication.

FIG. 1b shows a waveguide laser in which the surface 16 has been subjected to a material removal process, such as for example a dry etching process, in order to obtain the illustrated stepped surface formation with a waveguide ridge 15 extending in the longitudinal direction of the waveguide structure. The aforementioned material removal process gives rise to adjacent surfaces 42, which are formed on both sides of the waveguide ridge 15, and a top surface 41. The top surface 41 will be referred to in the following as carrier surface. Lateral confinement of the laser output signal is achieved by this waveguide ridge 15. The waveguide ridge exhibits a generally parallelepiped geometry with a substantially rectangular cross section and flat surfaces 41 and 42. In the exemplary embodiment of the invention the waveguide ridge is fabricated by optical lithography in combination with a dry etch process with an etch depth of 8.5 µm.

Figure 1C:
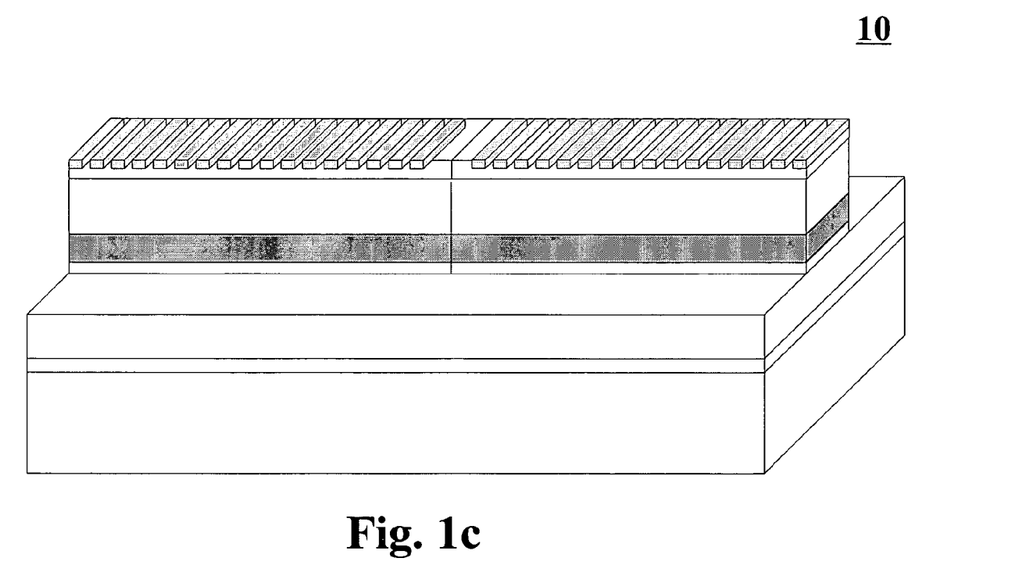
FIG. 1c is a schematic perspective view of the tunable unipolar laser in FIG. 1b in a subsequent stage of fabrication.
Figure 1D:
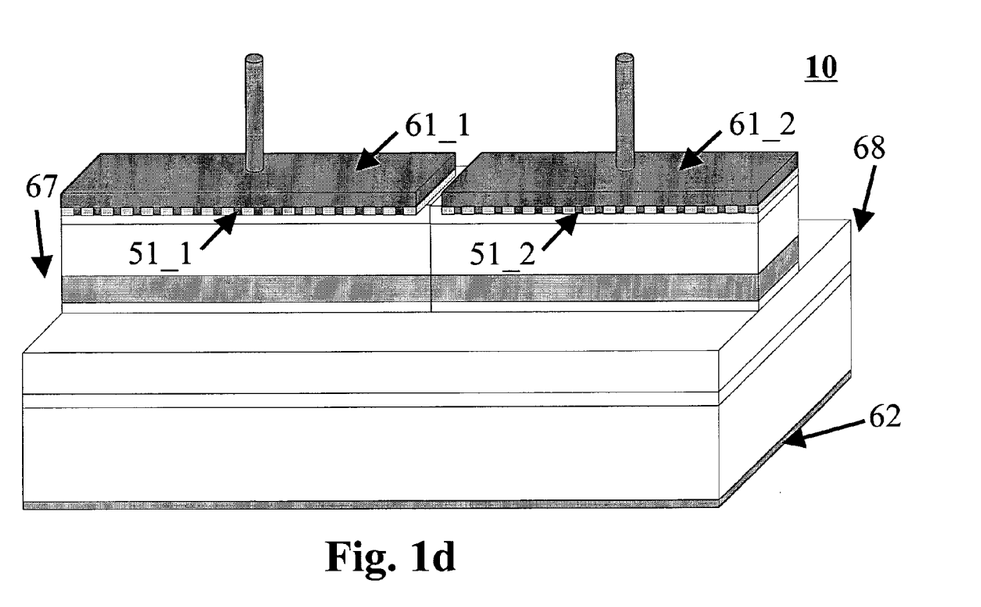
FIG. 1d is a schematic perspective view of the tunable unipolar laser in FIG. 1c in a subsequent stage of fabrication.

This waveguide ridge 15 is divided into a plurality of cavity segments (in this particular embodiment two: 15_1 and 152). These cavity segments can also be separated from each other by a coupling section (compare e.g., the embodiment of the tunable unipolar laser shown in FIG. 2). commencing from the waveguide ridge structure illustrated in FIG. 1b, the embodiment of a tuneable laser shown in FIGS. 1c and 1d is produced by forming various cavity segments with e.g., metallic lattice structures arranged on the carrier surfaces 41 by subjecting the carrier surface 41 of the waveguide ridge (15_1 and 15_2) to a lithographic process (e.g., by optical or electron beam lithography and a following patterning and metallization process not described in detail here). In the given example this metallization process is also used to define upper metallic electrodes 61_1 and 61_2 to each of the cavity segments (15_1 and 15_2). The lattice structures 51_1 and 51_2 formed along different cavity sections of the waveguide ridge are composed of several lattices with different lattice periods, thereby providing multiple allowed longitudinal optical modes. By changing the amplitudes and periods of the constituent lattices, a flexible control over the spectral position and the magnitude of the dips in the absorption/reflectivity of the lattice can be obtained. In this particular embodiment, the device comprises two sections carrying a lattice structure. In this particular embodiment, the lattice structure is defined atop the waveguide ridge in the upper cladding layer 35 by a dry etch process with an etch depth of approximately 1 µ. The lattice structure is subsequently metallized with top contact metals Cr with a thickness of 30 nm, Pt with a thickness of 150 nm and Au with a thickness of 2.5 µm. This process phase results in the tuneable unipolar laser illustrated in FIG. 1d with the metallic lattice structures 51_1 and 51_2 arranged on the carrier surface 41 above the active region 33. To be able to precisely define the position of the metallic lattice structures 51_1 and 51_2 arranged on top of the waveguide ridge relative to the active region 33, an additional layer (for example in the form of an etch stop layer) can be optionally provided in the epitaxial unipolar laser structure 12. The etching process used in the lithographic definition of the lattice structure will stop at this etch stop layer and thereby define the exact position of the metallic lattice structures 51_1 and 51_2 relative to the active region 33. A metallic electrode 62 coupled to the bottom surface of the semiconducting substrate facilitates current injection through the individual cavity sections of the device.

A particularly useful option for simplifying the fabrication of some embodiments of a unipolar laser is to define the lattice structures before the definition of the waveguide ridge.

Figure 2:
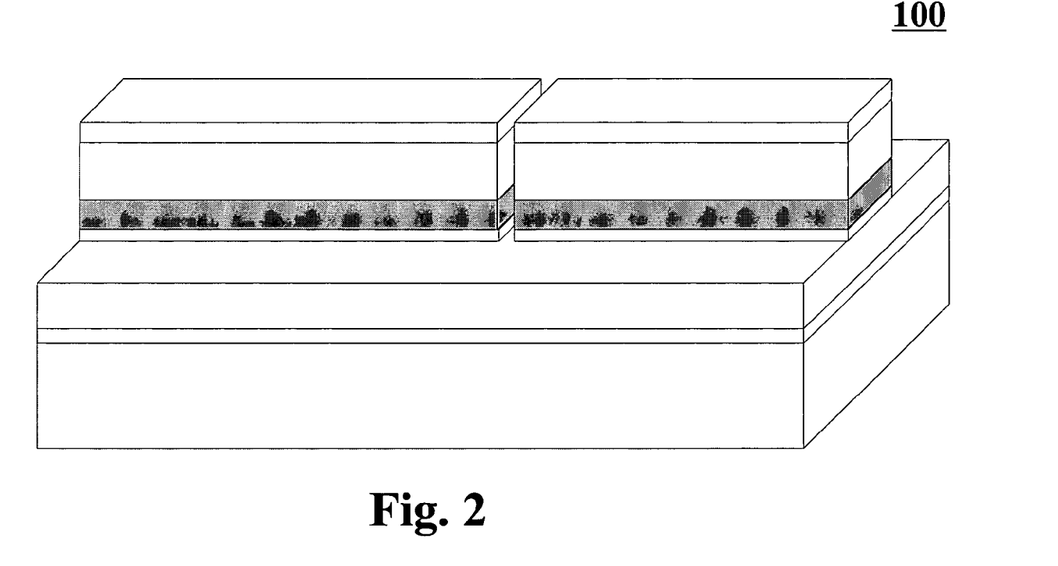
FIG. 2 is a schematic perspective view of another embodiment of the tunable unipolar laser including two lattice-free cavity sections. Longitudinal-mode selection in this case is given by the length of the cavity sections.

FIG. 2 shows a schematic perspective view of another embodiment of the tunable unipolar laser as laser 10. Tunable unipolar laser 100 is similar to laser 10 (compare FIG. 1b) except that in this case longitudinal mode selection in the cavity segments is not realized by lattice structures. Instead, by the length dimensions of the different cavity sections, the allowed longitudinal modes are determined. In this case the length of the segment is proportional to an integer number of half wavelengths of the electromagnetic radiation.

The coupling between cavities can be realized in various ways. In the simplest case an air gap between the different cavities can be used. This air gap is typically defined by a material removal process. The etch depth of this air gap influences the amount of coupling. In the extreme case of no existing air gap, maximum coupling between different cavity sections is achieved. But also different approaches e.g., based on coupling sections using photonic crystal structures given by two dimensional hole patterns or one dimensional slit patterns in the semiconductor can be used to achieve optimised coupling between different cavities.

A particularly useful approach in this context is to simultaneously define different cavity segments by the same lithographic and material removal process (e.g., etch process) as used for the definition of the waveguide ridge.

Figure 3:
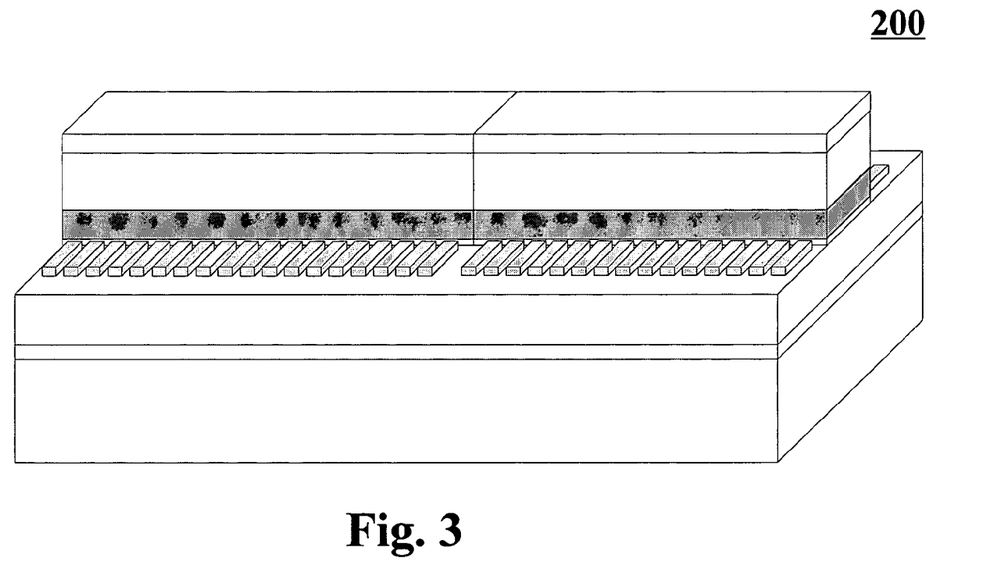
FIG. 3 is a schematic perspective view of another embodiment of the tunable unipolar laser with a lattice structure defined laterally along the waveguide ridge.

FIG. 3 shows a schematic perspective view of another embodiment of the tunable unipolar laser. Tunable unipolar laser 200 is similar to laser 10 (compare FIG. 1b) except that the lattice structures formed along different cavity sections in this case are defined laterally to the waveguide ridge on surface 42. Compared to laser 10 a different etch depth for optimised coupling is used in this case.

Figure 4:
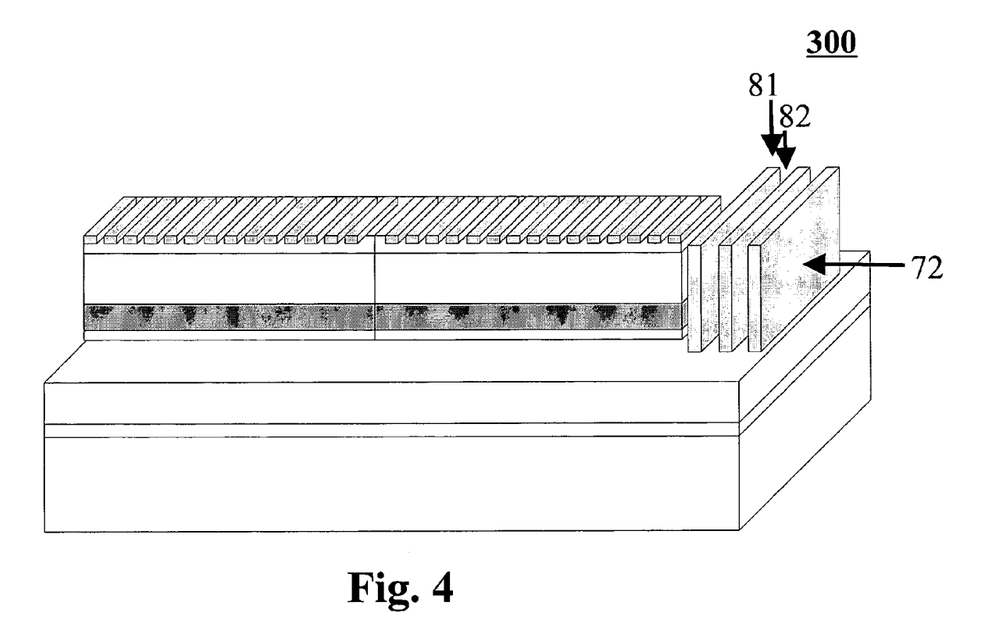
FIG. 4 is a schematic perspective view of another embodiment of the tunable unipolar laser with an air-semiconductor Bragg reflector defined adjacent to one end of the waveguide ridge.

FIG. 4 shows a schematic perspective view of another embodiment of the tunable unipolar laser. Tunable unipolar laser 300 is similar to laser 10 (compare FIG. 1b) except that an additional Bragg reflector structure 72 is situated adjacent to the waveguide ridge.

Unipolar semiconductor lasers 10 include opposed front and back facets 67 and 68 as shown in FIG. 1d. More particularly, front and back facets are crystal planes typically obtained by cleaving. Facets 67 and 68 are cleaved or coated facets.

A particularly useful approach for fabricating some embodiments of a unipolar laser is to increase facet reflectivity by the definition of a Bragg reflector using an air-semiconductor mirror structure as shown in FIG. 4 for one laser facet. These reflectors are arranged parallel to the laser facet at a certain distance from the facet. The width of the mirror plates 81 as well as the width of the air gap 82 depend on the emission wavelength of the device. The dimensions of the mirror plates can extend beyond the ridge widths dimensions to reduce diffraction losses of the laser light. A technological approach that is particularly advantageous is to define these mirror reflectors in parallel to the definition of the waveguide ridge (e.g., by a dry etch process). Different combinations of cleaved facets, coated facets as well as Bragg mirror reflectors based on plate/slit or hole structures can be used.

Figure 5:
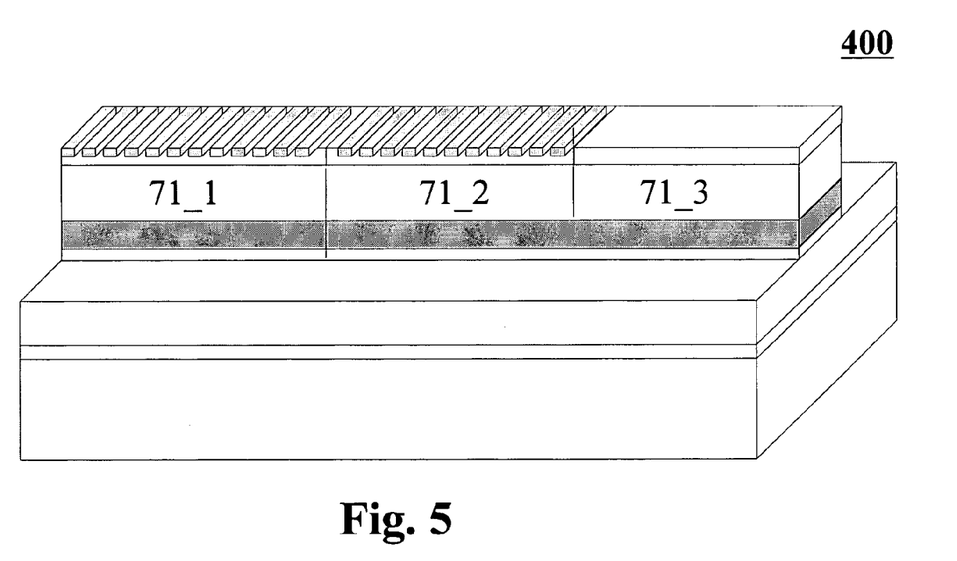
FIG. 5 is a schematic perspective view of another embodiment of the tunable unipolar laser with an additional lattice-free 'gain-section'.

FIG. 5 shows a schematic perspective view of another embodiment of the tunable unipolar laser. Tunable unipolar laser 400 is similar to laser 10 (compare FIG. 1b) except that an additional lattice-free gain section 71_3 is included.

Figure 6:
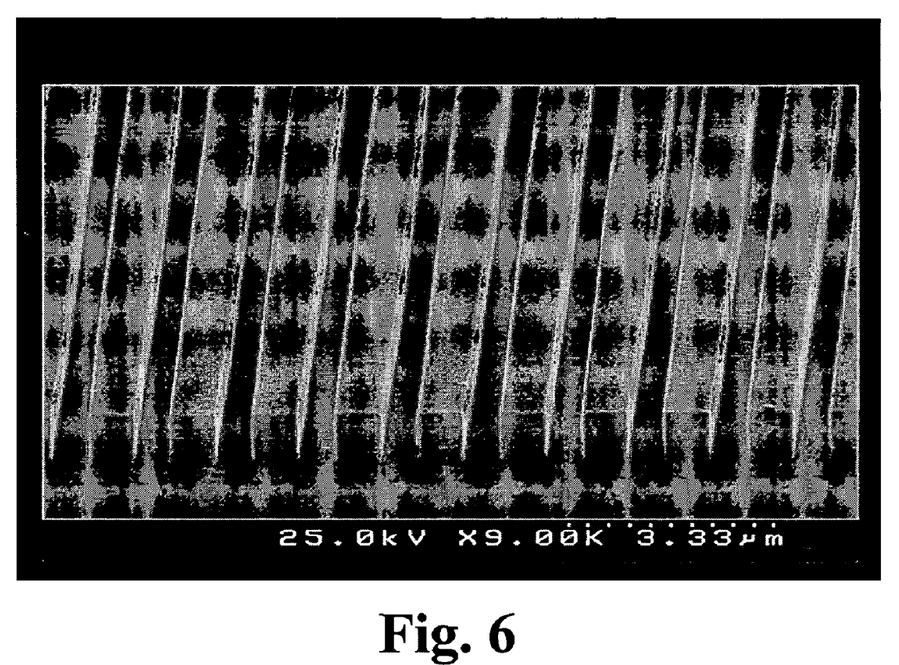
FIG. 6 is a scanning electron microscope image of the lattice structure arranged atop of the waveguide (compare FIG. 1c).

FIG. 6 shows an electron microscope image of a lattice structure formed atop one of the cavity segments of a two cavity segment laser (before the metallization) as schematically illustrated in FIG. 1c. The characteristics of the lattice structure are determined by the distance between the lattice ridges, the geometric configuration of the lattice ridges, and the metal used for the subsequent metallization.

Figure 7:
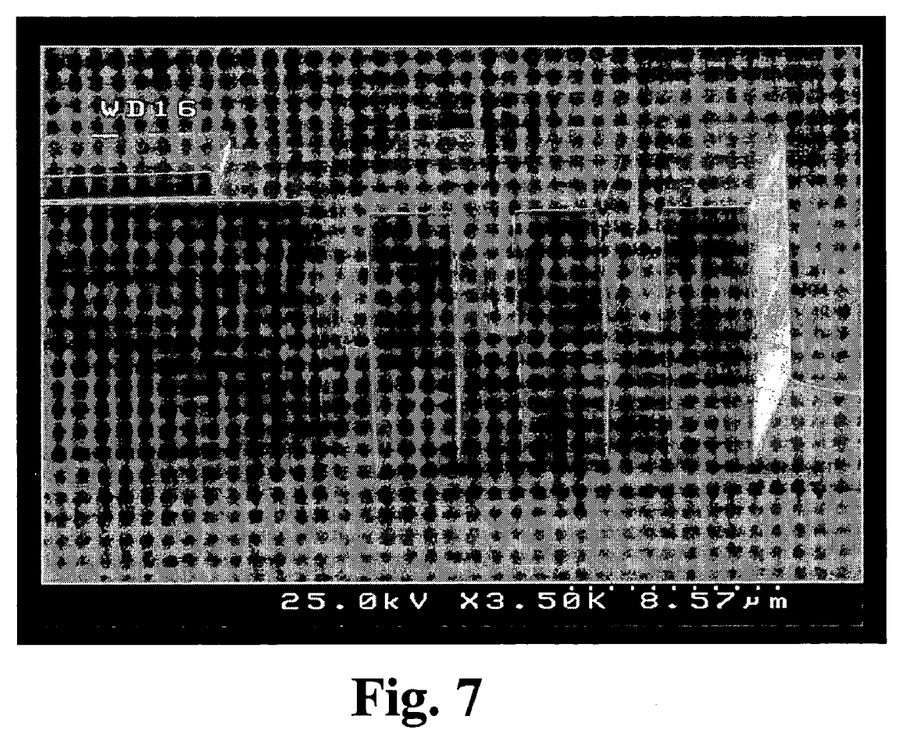
FIG. 7 is a scanning electron microscope image of a DBR structure arranged adjacent to the waveguide ridge (compare FIG. 4).

FIG. 7 shows an electron microscope image of a Bragg reflector structure adjacent to the end of one of the cavity segments of a two cavity segment laser as schematically illustrated in FIG. 4. The characteristics of the Bragg reflector structure are determined by the distance between the mirror plates, the geometric configuration of the mirror plates and the air gaps.

Figure 8:
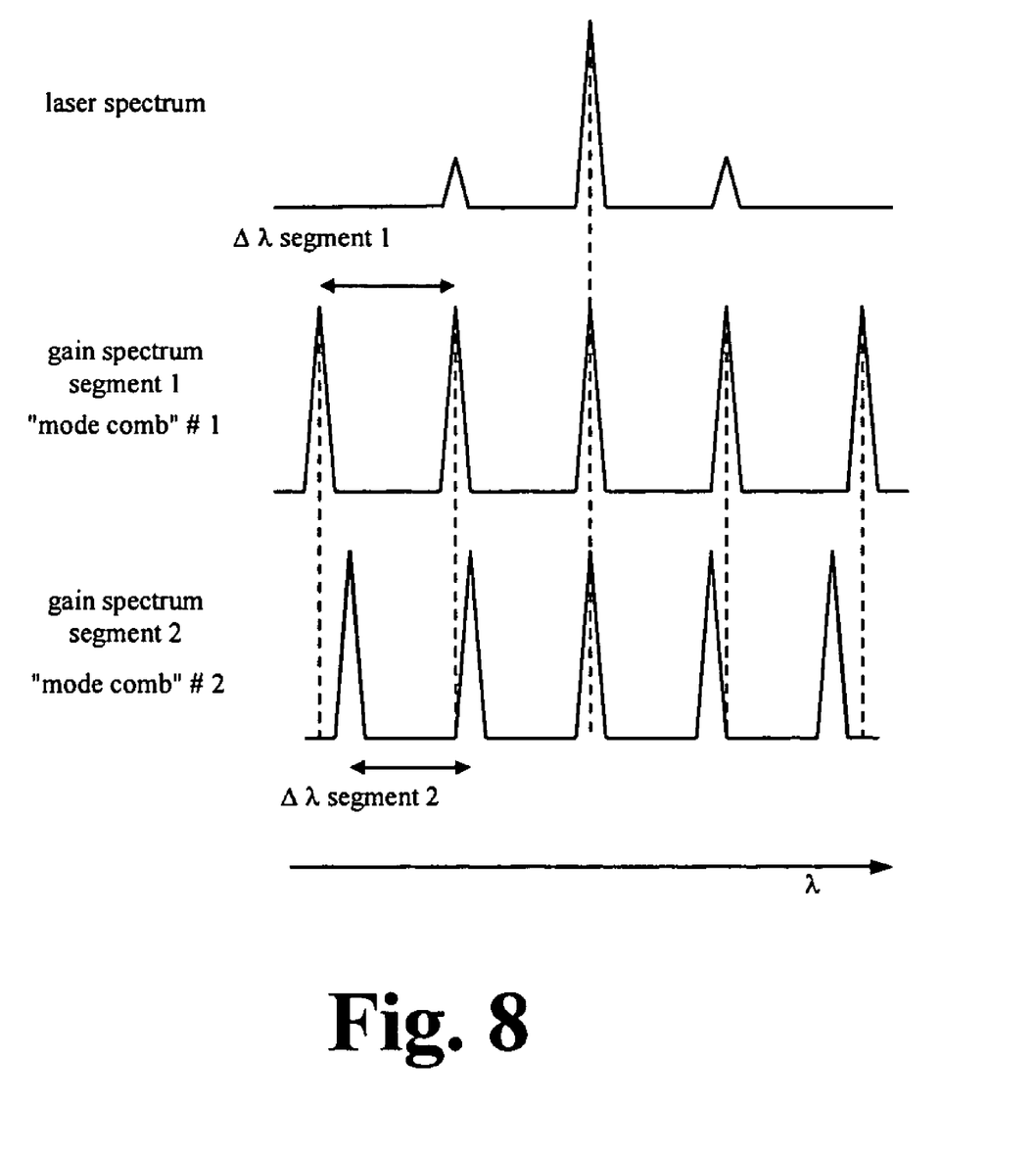
FIG. 8 shows longitudinal mode combs for two different cavity segments and qualitatively illustrates the selection of the laser wavelength.

FIG. 8 contains a schematic illustration of the selection of the laser wavelength for laser 10. Two longitudinal mode combs of different cavity segments of the laser have a different spacing of their allowed modes so they overlap only at one spectral position. The resulting laser spectrum is displayed at the top of FIG. 8. Tuning can be achieved by displacing the two mode combs of the cavity segments relative to each other by a change of the injection currents.

In the given case of laser 10 a two cavity section unipolar tuneable laser has been demonstrated. In the demonstrated example of laser 10, each cavity section carries a lattice structure. However, it is to be understood that the present claims are intended to cover cavities with and without lattice structures in arbitrary combinations.

While specific embodiments of the invention have been shown and described in detail to illustrate the application of the principles of the invention, it will be understood that the invention may be embodied otherwise without departing from such principles.

What is claimed is:

1. A unipolar semiconductor laser comprising:
   a) a semiconducting substrate having a first electrode in contact therewith; and,
   b) an epitaxial structure on said semiconducting substrate wherein said epitaxial structure comprises;
      b1) a lower cladding layer atop said semiconducting substrate; and,
      b2) a lower guiding layer atop said lower cladding layer; and,
      b3) an active region atop said lower guiding layer; and,
      b4) an upper guiding layer atop said active region; and,
      b5) an upper cladding layer atop said upper guiding layer; and
   wherein said semiconducting substrate and said epitaxial layer comprise doped semiconducting material of only a single conductivity type; and,
   wherein said epitaxial structure has the form of a waveguide ridge comprising at least two cavity sections and further comprising two or more second electrodes, each of said second electrodes in contact with a different of said at least two cavity sections; and,
   wherein each adjacent pair of said cavity sections is joined by a coupling section; and,
   wherein said unipolar semiconductor laser is capable of producing single longitudinal mode laser light tunable over a range of wavelengths.

2. The semiconductor laser according to claim 1 further comprising one or more lattice structures having positions atop one or more of said at least two cavity sections, or laterally adjacent to said waveguide ridge, or both.

3. The semiconductor laser according to claim 2, wherein said one or more lattice structures include metal.

4. The semiconductor laser according to claim 3, wherein said metal is one or more of Cr, Pt and Au.

5. The semiconductor laser according to claim 2, wherein said at least two cavity sections are optically connected while capable of being separately pumped electrically by said two or more second electrodes.

6. The semiconductor laser according to claim 1, wherein at least one of said coupling sections joining each adjacent pair of said cavity sections is an air gap.

7. The semiconductor laser according to claim 1, wherein at least one of said coupling sections joining each adjacent pair of said cavity sections is a photonic crystal structure.

8. The semiconductor laser according to claim 2, wherein at least one of said coupling sections joining each adjacent pair of said cavity sections is a photonic crystal structure.

9. The semiconductor laser according to claim 1, wherein three cavity sections are present and wherein two of said cavity sections have a lattice structure and the third of said cavity sections lacks a lattice structure.

10. The semiconductor laser according to claim 1, further comprising an air-semiconductor mirror structure located adjacent to the front facet of said semiconductor laser, or to the back facet of said semiconductor laser, or both, and having an orientation substantially perpendicular to the central axis of said waveguide ridge.

11. The semiconductor laser according to claim 2 wherein at least a portion of said one or more lattice structures includes material wherein said material has variation of the real part of its index of refraction, or variation of the imaginary part of its index of refraction, or variation of both.

* * * * *